(12) United States Patent
Inoue et al.

(10) Patent No.: US 7,903,012 B2
(45) Date of Patent: Mar. 8, 2011

(54) D/A CONVERTER AND REFERENCE VOLTAGE CIRCUIT INCLUDING SAME

(75) Inventors: Takahiro Inoue, Osaka (JP); Hideki Shioe, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 2 days.

(21) Appl. No.: 12/457,363

(22) Filed: Jun. 9, 2009

(65) Prior Publication Data

US 2009/0309776 A1 Dec. 17, 2009

(30) Foreign Application Priority Data

Jun. 13, 2008 (JP) .................................. 2008-155987

(51) Int. Cl.
*H03M 3/00* (2006.01)
(52) U.S. Cl. ........................... 341/144; 341/153; 341/154

(58) Field of Classification Search .................. 341/144, 341/154, 153
See application file for complete search history.

(56) References Cited

U.S. PATENT DOCUMENTS

| 5,808,576 | A  | * | 9/1998  | Chloupek et al. | 341/144 |
| 6,617,989 | B2 | * | 9/2003  | Deak            | 341/144 |
| 7,602,326 | B2 | * | 10/2009 | Lan             | 341/145 |

FOREIGN PATENT DOCUMENTS

JP 06-224767 8/1994

* cited by examiner

*Primary Examiner* — Brian Young
(74) *Attorney, Agent, or Firm* — Harness, Dickey & Pierce, PLC

(57) ABSTRACT

A variable resistor is connected to each terminal of $(2^n)-1$ resistors R connected in series. The variable resistors have resistances RH and RL determined according to a digital signal containing m lower bits LoB<m−1:0>.

11 Claims, 7 Drawing Sheets

D/A CONVERTER AND REFERENCE VOLTAGE CIRCUIT INCLUDING SAME

This nonprovisional application claims priority under 35 U.S.C. §119(a) on Patent Application No. 2008-155987 filed in Japan on Jun. 13, 2008, the entire contents of which are hereby incorporated by reference.

TECHNICAL FIELD

The present invention relates to D/A converters and reference voltage circuits including such a D/A converter.

BACKGROUND ART

Recent reference voltage circuits for grayscale or opposite electrode application in liquid crystal displays are required to be capable of 9 or greater bit outputs and high precision monotonicity. Resistor-string D/A converters used in these reference voltage circuits are advantageously generally suitable for high speed operation and readily provides monotonicity. For 9 or greater bit outputs, however, the resistor-string D/A converter is not practical because of its increased number of wires (512 wires for 9 bit outputs), resistors, and switches.

FIG. 6 is a circuit diagram of a conventional resistor-string D/A converter 100. The D/A converter 100 includes a resistor-string circuit 101 producing divided voltages from reference voltages VH and VL and a switching circuit containing switches for switching between divided voltage outputs vref<0> to vref<(2^n)-1>.

An analog output voltage Vout obtained by conversion of an n-bit digital signal is given by equation (1):

$$Vout = VL + (VH - VL) * k/2 \wedge n \qquad (1)$$

where k=0 to 2^n-1.

The digital signal fed to the D/A converter 100 consists of n upper bits HoB<n-1:0> and m lower bits LoB<m-1:0>.

The D/A converter 100 in FIG. 6 is not practical for high bit output applications due to an increased number of wires, resistors, and switches. For example, for n=9 (9-bit conversion), the D/A converter 100 needs 512 wires, 512 resistors, and 512 switches. Likewise, for n=10 (10-bit conversion), the D/A converter 100 needs 1024 wires, 1024 resistors, and 1024 switches.

FIG. 7 is a circuit diagram of another conventional resistor-string D/A converter 103. The D/A converter 103 is disclosed in Japanese Patent Application Publication, Tokukaihei, No. 6-224767 (Publication Date: Aug. 12, 1994, Patent Literature 1).

The D/A converter 103 includes a D/A converter 104 producing a reference voltage VH_1 in accordance with n upper bits HoB<n-1:0> for output, a D/A converter 105 producing a reference voltage VL_1 in accordance with the n upper bits HoB<n-1:0> for output, a resistor-string circuit 106 producing divided voltages from reference voltages VH_1 and VL_1 in accordance with m lower bits LoB<m-1:0>, and a switching circuit 107 switching between divided voltage outputs vref<0> to vref<(2^m)-1>.

The digital signal fed to the D/A converter 103 consists of the n upper bits HoB<n-1:0> and the m lower bits LoB<m-1:0>.

An analog output voltage Vout obtained by conversion of an (n+m)-bit digital signal consisting of n upper bits and m lower bits is given by equation (4) (derived from equations (2) and (3)):

$$VH\_1 = VL + (VH - VL) * (1+1)/2 \wedge n \qquad (2)$$

$$VL\_1 = VL + (VH - VL) * 1/2 \wedge n \qquad (3)$$

$$\begin{aligned} Vout &= VL\_1 + (VH\_1 - VL\_1) * k/2 \wedge n \qquad (4)\\ &= VL + (VH - VL) * 1/2 \wedge n + \\ &\quad \{(VH - VL) * (1+1)/2 \wedge n - \\ &\quad (VH - VL) * 1/2 \wedge n\} * k/2 \wedge n \\ &= VL + (VH - VL) * 1/2 \wedge n + \\ &\quad (VH - VL) * 1/2 \wedge n * k/2 \wedge m \\ &= VL + (VH - VL) * \{1 * 2 \wedge m + k\}/2 \wedge (n+m) \end{aligned}$$

where k=0 to 2^m-1 and 1=0 to 2^n-1.

Equations (2) and (3) differ in "1+1" and "1". The reason is that the D/A converter 104 receives a digital signal input containing the n upper bits HoB<n-1:0> and produces a reference voltage VH_1 that is equivalent to the digital signal containing the n upper bits HoB<n-1:0> plus 1 for output, whereas the D/A converter 105 receives a digital signal input containing the n upper bits HoB<n-1:0> and produces a reference voltage VL_1 that is equivalent to the digital signal containing the n upper bits HoB<n-1:0> for output.

To obtain equations (2) and (3), the D/A converter 104 and the D/A converter 105 may be the same D/A converters so that the D/A converter 104 can receive a digital signal input containing the n upper bits HoB<n-1:0> plus 1 and the D/A converter 105 can receive a digital signal input containing the n upper bits HoB<n-1:0>.

For example, for n=2 and m=7 (9-bit digital signal conversion), the D/A converter 103 in FIG. 7 needs 128 wires, 128 resistors, and 128 switches. Likewise, for n=2 and m=8 (10-bit digital signal conversion), the D/A converter 103 needs 256 wires, 256 resistors, and 256 switches. The D/A converter 103 in FIG. 7 needs fewer wires, resistors, and switches than the D/A converter 100 in FIG. 6.

The D/A converter 100 in FIG. 6 is not practical for 9 or greater bit output applications because of its increased number of wires, resistors, and switches.

Although the D/A converter 103 in FIG. 7 needs fewer wires, resistors, and switches than the D/A converter 100 in FIG. 6, the D/A converter 103 needs the D/A converters 104 and 105 to produce the reference voltages VH_1 and VL_1 respectively before the resistor-string circuit 106, which adds to circuit size. Furthermore, the provision of the D/A converters 104 and 105 could lead to undesirable increases in current consumption and degradation in precision of D/A conversion.

SUMMARY OF INVENTION

The present invention has an objective of providing a small circuit size, high precision D/A converter capable of conversion of high bit digital signals.

A D/A converter according to the present invention is, to achieve the objective, a D/A converter for converting a digital signal consisting of n upper bits and m lower bits to an analog voltage. The converter includes: voltage dividing means containing (2 n)−1 resistors of an equal resistance connected in series, a first reference voltage and a second reference voltage being applied across both terminals of the resistors; selecting means for selecting, according to the n upper bits of the digital signal, a divided voltage produced by the voltage dividing means for output as the analog voltage; and two variable resistors connected to the terminals of the $(2^n)-1$ resistors connected in series, the variable resistors exhibiting resistances determined according to the m lower bits of the digital signal.

According to the invention, the analog voltage is produced by means of the resistances determined in the two variable resistors according to the m bits of the digital signal. The invention requires fewer wires connecting the voltage dividing means to the selecting means, fewer resistors, and fewer switches in the selecting means than the conventional D/A converter. Circuit size is thus reduced. A D/A converter is realized which is capable of converting high bit (9 to 11 bits) digital signals.

Unlike the conventional D/A converter, the D/A converter of the invention needs no internal D/A converters. Therefore, current consumption does not increase due to the addition of D/A converters. Precision in D/A conversion is dictated by the relative precision of the two variable resistors connected to the reference voltages. Thus, the precision in D/A conversion does not fall by as great an amount as is the case with the conventional D/A converter. A high precision D/A converter is provided.

Additional objectives, advantages and novel features of the invention will be set forth in part in the description which follows, and in part will become apparent to those skilled in the art upon examination of the following or may be learned by practice of the invention.

BRIEF DESCRIPTION OF DRAWINGS

FIG. 1 is a circuit diagram of a D/A converter in accordance with an example of the present invention.

FIG. 2 is a circuit diagram of a variable resistor for m=3 (m is the number of lower bits contained in a digital signal) in a D/A converter in accordance with an example of the present invention.

FIG. 3 is a circuit diagram of a D/A converter in accordance with another example of the present invention.

FIG. 4 is a circuit diagram of a variable resistor for m=3 in a D/A converter in accordance with another example of the present invention.

FIG. 5 is a circuit diagram of a D/A converter in accordance with a further example of the present invention.

FIG. 6 is a circuit diagram of a conventional resistor-string D/A converter.

FIG. 7 is a circuit diagram of another conventional resistor-string D/A converter.

DESCRIPTION OF EMBODIMENTS

The following will describe an embodiment of the present invention by means of examples 1 to 3 and in reference to FIGS. 1 to 5.

Example 1

Figure 1:
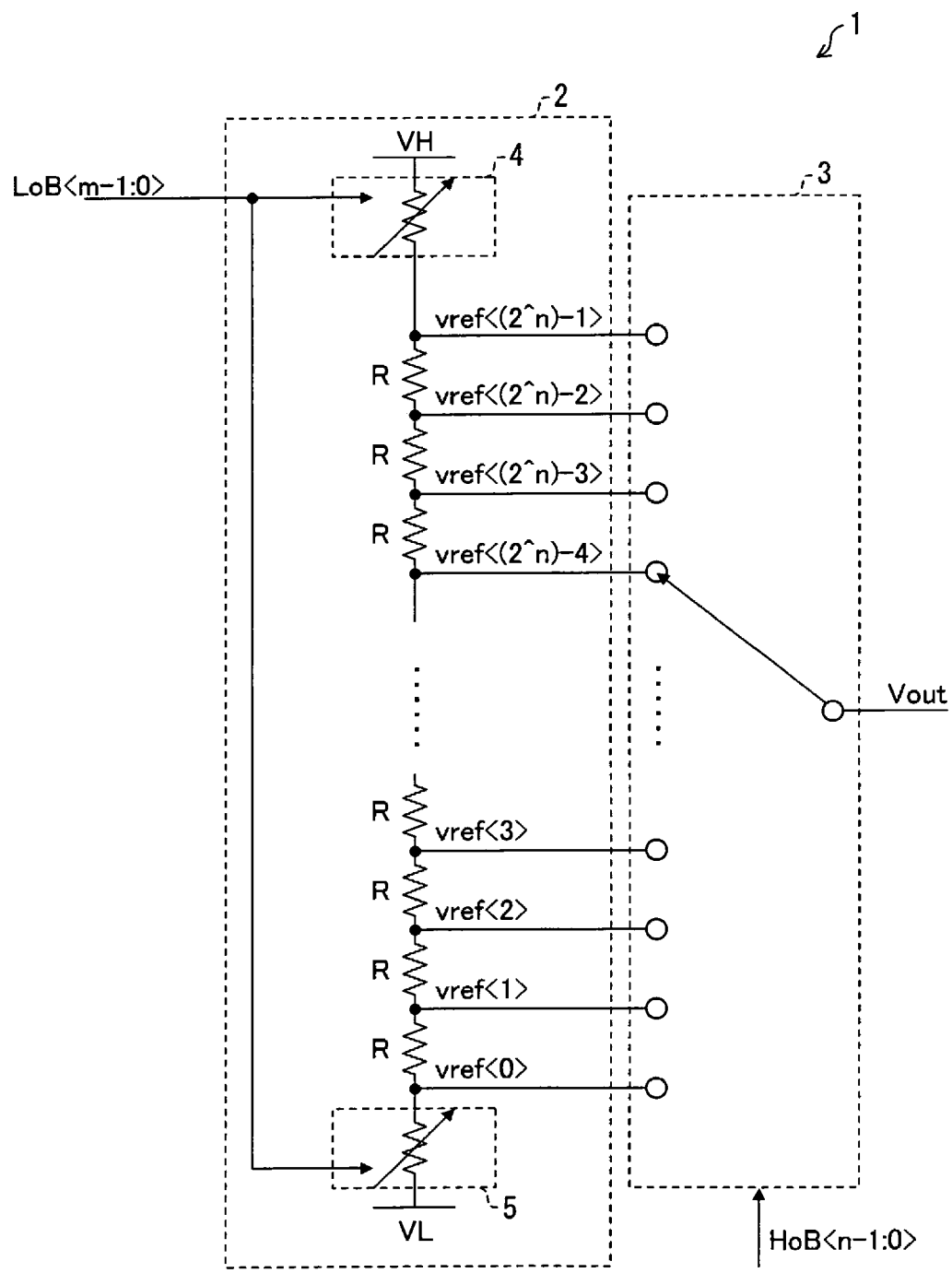
FIG. 1

FIG. 1 is a circuit diagram of a D/A converter 1 in accordance with example 1. The D/A converter 1 includes a resistor-string circuit 2 producing divided voltages from reference voltages VH and VL and a switching circuit 3 containing switches for switching between divided voltage outputs vref<0> to vref<$(2^n)-1$>.

The resistor-string circuit 2 includes $(2^n)-1$ resistors R, a variable resistor 4, and a variable resistor 5. The reference voltage VH is applied to a terminal of the variable resistor 4, and the reference voltage VL is applied to a terminal of the variable resistor 5. The $(2^n)-1$ resistors R are connected in series between the other terminal of the variable resistor 4 and the other terminal of the variable resistor 5.

A digital signal input to the D/A converter 1 consists of n upper bits HoB<n-1:0> and m lower bits LoB<m-1:0>. The n upper bits HoB<n-1:0> consists of bits $H_{n-0}$ to $H_0$. The m lower bits LoB<m-1:0> consists of bits $L_{m-1}$ to $L_0$. In the notation $H_{n-1}$ to $H_0$ and $L_{m-1}$ to $L_0$, greater subscripted numerals indicate higher bits. The bit $H_{n-1}$ is the most significant bit, and the bit $L_0$ is the least significant bit.

The resistance RH of the variable resistor 4 and the resistance RL of the variable resistor 5 are determined according to the m lower bits LoB<m-1:0> of the digital signal and given respectively by equations (5) and (6).

$$RH=(2^m-k)/(2^m)*R \quad (5)$$

$$RL=k/(2^m)*R \quad (6)$$

where k=0 to $2^m-1$. From equations (5) and (6), it is appreciated that RH+RL=R.

The divided voltage output vref<0> is the output at the contact of the variable resistor 5 and a resistor R. The divided voltage output vref<$2^n-1$> is the output at the contact of the variable resistor 4 and a resistor R. For x=1 to $2^n-2$, vref<x> is the output at the contact of the x-th and (x+1)-th resistors R as counted from the side of the variable resistor 5. For example, vref<1> is the output at the contact of the first and second resistors R as counted from the side of the variable resistor 5.

The switching circuit 3 selects one of the divided voltage outputs vref<0> to vref<$2^n-1$> according to the n upper bits HoB<n-1:0> of the digital signal. As an example, if n=2 and the upper two bits HoB<1:0> are representing a binary "10", the switching circuit 3 selects vref<2>, hence Vout=vref<2> because "10" in binary is "2" in decimal notation.

The analog output voltage Vout, obtained by conversion of an (n+m)-bit digital signal consisting of n upper bits and m lower bits, is given by equation (7):

$$Vout=VL+(VH-VL)*(RL+R*1)/\{RH+RL+R*(2^n-1)\} \quad (7)$$

Equation (8) is derived by substituting RH and RL of equations (5) and (6) to equation (7).

$$Vout=VL+(VH-VL)*(k/2^m*R+R*1)/\{(2^m-k)/(2^m)*R+k/(2^m)*R+R*(2^n-1)\} \quad (8)$$

By dividing both the denominator and the numerator in the second term on the right side of equation (8) by R, equation (9) is obtained:

$$Vout=VL+(VH-VL)*\{k/(2^m)+1\}/\{(2^m-k)/(2^m)+k/(2^m)+(2^n-1)\} \quad (9)$$

By substituting equation (10) into the right side of equation (8), equation (11) is obtained.

$$(2^m-k)/(2^m)+k/(2^m)=1 \quad (10)$$

$$Vout=VL+(VH-VL)*\{k/(2^m)+1\}/\{1+(2^n-1)\} \quad (11)$$

Arranging equation (11) yields equation (12).

$$Vout=VL+(VH-VL)*\{k/(2^m)+1\}/2^n \quad (12)$$

The output voltage Vout is given by equation (13) which is derived by multiplying the denominator and the numerator in the second term on the right side of equation (12) by $2^m$.

$$Vout=VL+(VH-VL)*(k+1*2^m)/2^{(m+n)} \quad (13)$$

A D/A converter capable of 9 or greater bit digital signal conversion is to be built around the D/A converter 1. Assume in the D/A converter 1, for example, that n=2 and m=7 for a 9-bit digital signal conversion, in which case there are $2^7=128$ wires connecting the resistor-string circuit 2 to the switching circuit 3, $2^7-1=127$ resistors R, and $2^7=128$ switches in the switching circuit 3.

Likewise, for n=2 and m=8 for a 10-bit digital signal conversion in the D/A converter 1, there are $2^8=256$ wires connecting the resistor-string circuit 2 to the switching circuit 3, $2^8-1=255$ resistors R, and $2^8=256$ switches in the switching circuit 3.

Likewise, for n=2 and m=9 for a 11-bit digital signal conversion in the D/A converter 1, there are $2^9=512$ wires connecting the resistor-string circuit 2 to the switching circuit 3, $2^9-1=511$ resistors R, and $2^9=512$ switches in the switching circuit 3.

Figure 6:
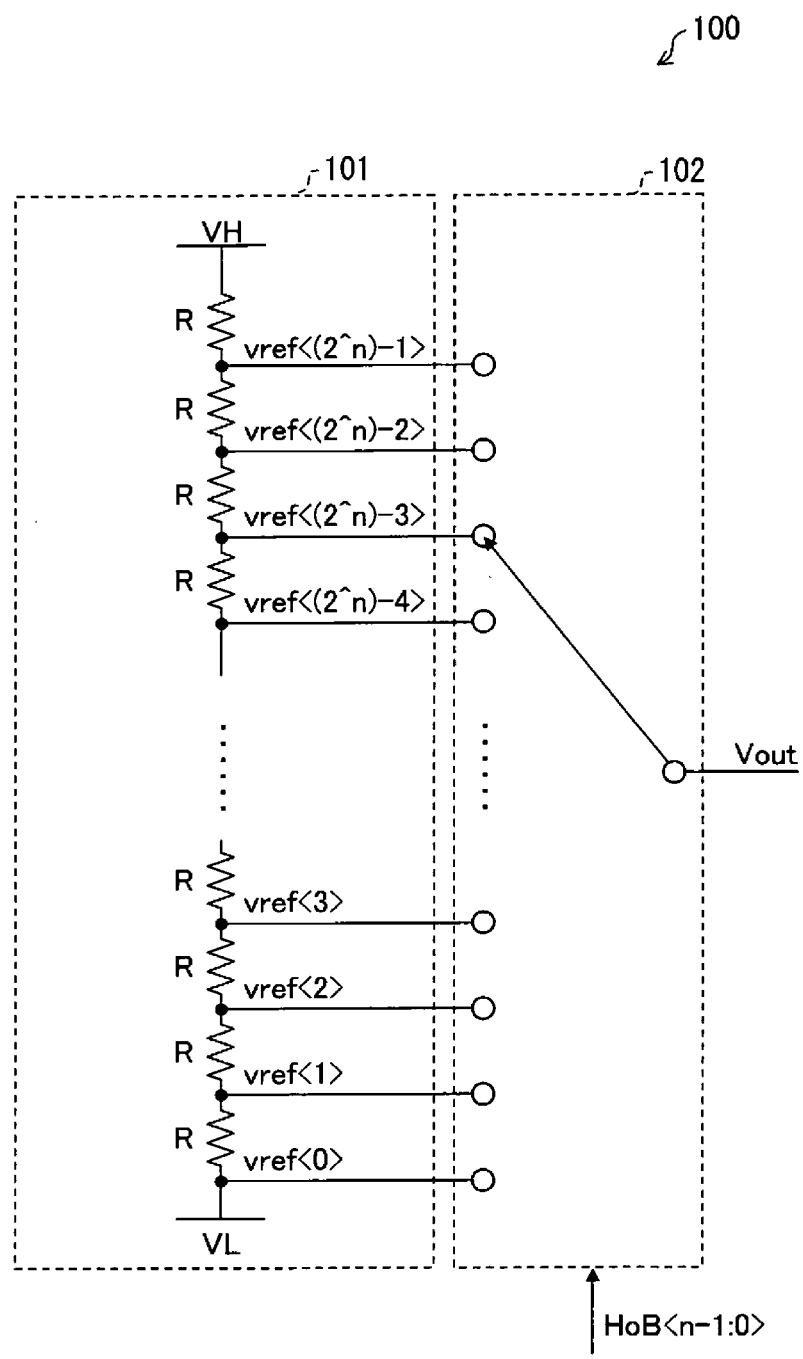
FIG. 6

As described in the foregoing, the output voltage Vout is produced by means of the resistances RH and RL of the variable resistors 4 and 5 determined according to the m-bit digital signal. The D/A converter 1 therefore requires fewer wires connecting the resistor-string circuit 2 to the switching circuit 3, fewer resistors R, and fewer switches in the switching circuit 3 than the conventional D/A converter 100 shown in FIG. 6. Circuit size is thus reduced. A D/A converter is realized which is capable of converting high bit (9 to 11 bits) digital signals.

Figure 7:
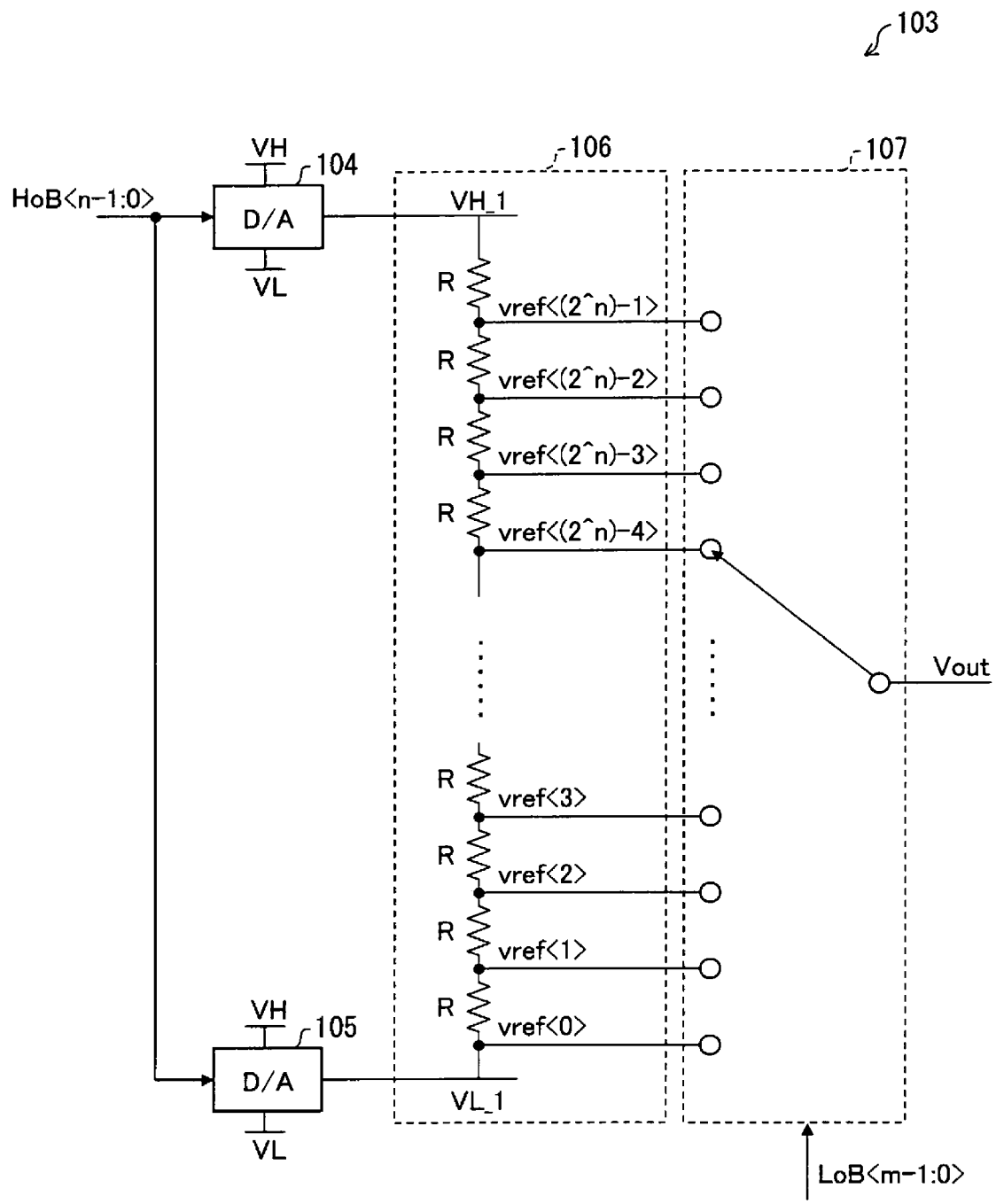
FIG. 7

Unlike the conventional D/A converter 103 shown in FIG. 7, the D/A converter 1 needs no internal D/A converters. Therefore, current consumption does not increase due to the addition of D/A converters. Precision in D/A conversion is dictated by the relative precision of the variable resistors 4 and 5 connected to the reference voltages VH and VL. Thus, the precision in D/A conversion does not fall by as great an amount as is the case with the D/A converter 103. A high precision D/A converter is provided.

Figure 2:
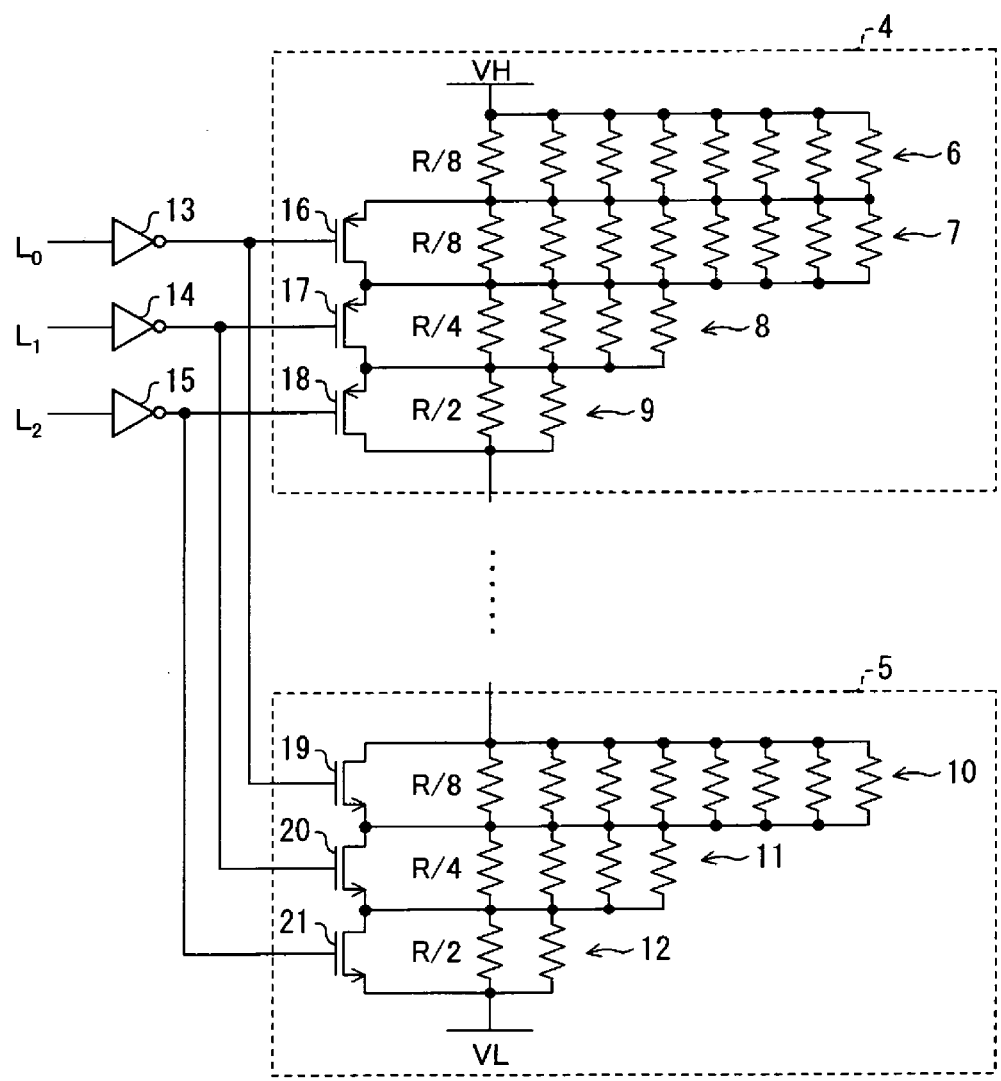
FIG. 2

FIG. 2 is a circuit diagram of the variable resistors 4 and 5 when m=3 in the D/A converter 1. In FIG. 2, the variable resistor 4 includes parallel resistors 6 to 9 and p-channel MOSFETs (metal-oxide-semiconductor field-effect transistor) 16 to 18. The variable resistor 5 includes parallel resistors 10 to 12 and n-channel MOSFETs 19 to 21. Similarly to FIG. 1, $(2^n)-1$ resistors R are connected in series between the variable resistors 4 and 5.

The parallel resistors 6, 7, and 10 each contain eight resistors R connected in parallel to exhibit a resistance of R/8. The parallel resistors 8 and 11 each contain four resistors R connected in parallel to exhibit a resistance of R/4. The parallel resistors 9 and 12 each contain two resistors R connected in parallel to exhibit a resistance of R/2.

The reference voltage VH is applied to a terminal of the parallel resistor 6. The other terminal of the parallel resistor 6 is connected to a terminal of the parallel resistor 7 and the source of the p-channel MOSFET 16. The other terminal of the parallel resistor 7 is connected to a terminal of the parallel resistor 8, the drain of the p-channel MOSFET 16, and the source of the p-channel MOSFET 17. The other terminal of the parallel resistor 8 is connected to a terminal of the parallel resistor 9 and the source of the p-channel MOSFET 18. The other terminal of the parallel resistor 9 is connected to a terminal of a resistor R and the source of the p-channel MOSFET 18.

A terminal of the parallel resistor 10 and the drain of the n-channel MOSFET 19 are connected to a terminal of a resistor R other than the resistor R to which the parallel resistor 9 is connected. The other terminal of the parallel resistor 10 is connected to a terminal of the parallel resistor 11, the source of the n-channel MOSFET 19, and the drain of the n-channel MOSFET 20. The other terminal of the parallel resistor 11 is connected to a terminal of the parallel resistor 12, the source of the n-channel MOSFET 20, and the drain of the n-channel MOSFET 21. The reference voltage VL is applied to the other terminal of the parallel resistor 12 and the source of the n-channel MOSFET 21.

The output of the inverter 13 is connected to the gate of the p-channel MOSFET 16 and the gate of the n-channel MOSFET 19. The output of the inverter 14 is connected to the gate of the p-channel MOSFET 17 and the gate of the n-channel MOSFET 20. The output of the inverter 15 is connected to the gate of the p-channel MOSFET 18 and the gate of the n-channel MOSFET 21.

The least significant bit $L_0$ is supplied to the input of the inverter 13. A lower bit $L_1$ is supplied to the input of the inverter 14. A lower bit $L_2$ is supplied to the input of the inverter 15.

Suppose, as an example, that k=6, that is, $(L_2, L_1, L_0)=(1, 1, 0)$, in which case the output of the inverter 13 is High, and the output of the inverter 14 and the output of the inverter 15 are Low. That turns off the p-channel MOSFET 16 and the n-channel MOSFETs 20 and 21 and turns on the p-channel MOSFETs 17 and 18 and the n-channel MOSFET 19.

The resistance RH of the variable resistor 4 is therefore equal to 2R/8 as shown in equation (14) below:

$$RH=R/8+R/8=2R/8 \quad (14)$$

The resistance RL of the variable resistor 5 is equal to 6R/8 as shown in equation (15) below:

$$RL=R/4+R/2=6R/8 \quad (15)$$

The RH and RL shown in equations (5) and (6) respectively are readily obtained by giving weights of $2^m$ to the variable resistors 4 and 5 as above.

Table 1 shows relationship between $(L_2, L_1, L_0)$, the resistance RH of the variable resistor 4, the resistance RL of the variable resistor 5, and RH+RL.

TABLE 1

| (L2, L1, L0) | RH | RL | RH + RL |
| --- | --- | --- | --- |
| (0, 0, 0) | 8R/8 | 0 | R |
| (0, 0, 1) | 7R/8 | R/8 | R |
| (0, 1, 0) | 6R/8 | 2R/8 | R |
| (0, 1, 1) | 5R/8 | 3R/8 | R |
| (1, 0, 0) | 4R/8 | 4R/8 | R |
| (1, 0, 1) | 3R/8 | 5R/8 | R |
| (1, 1, 0) | 2R/8 | 6R/8 | R |
| (1, 1, 1) | R/8 | 7R/8 | R |

Example 2

Figure 3:
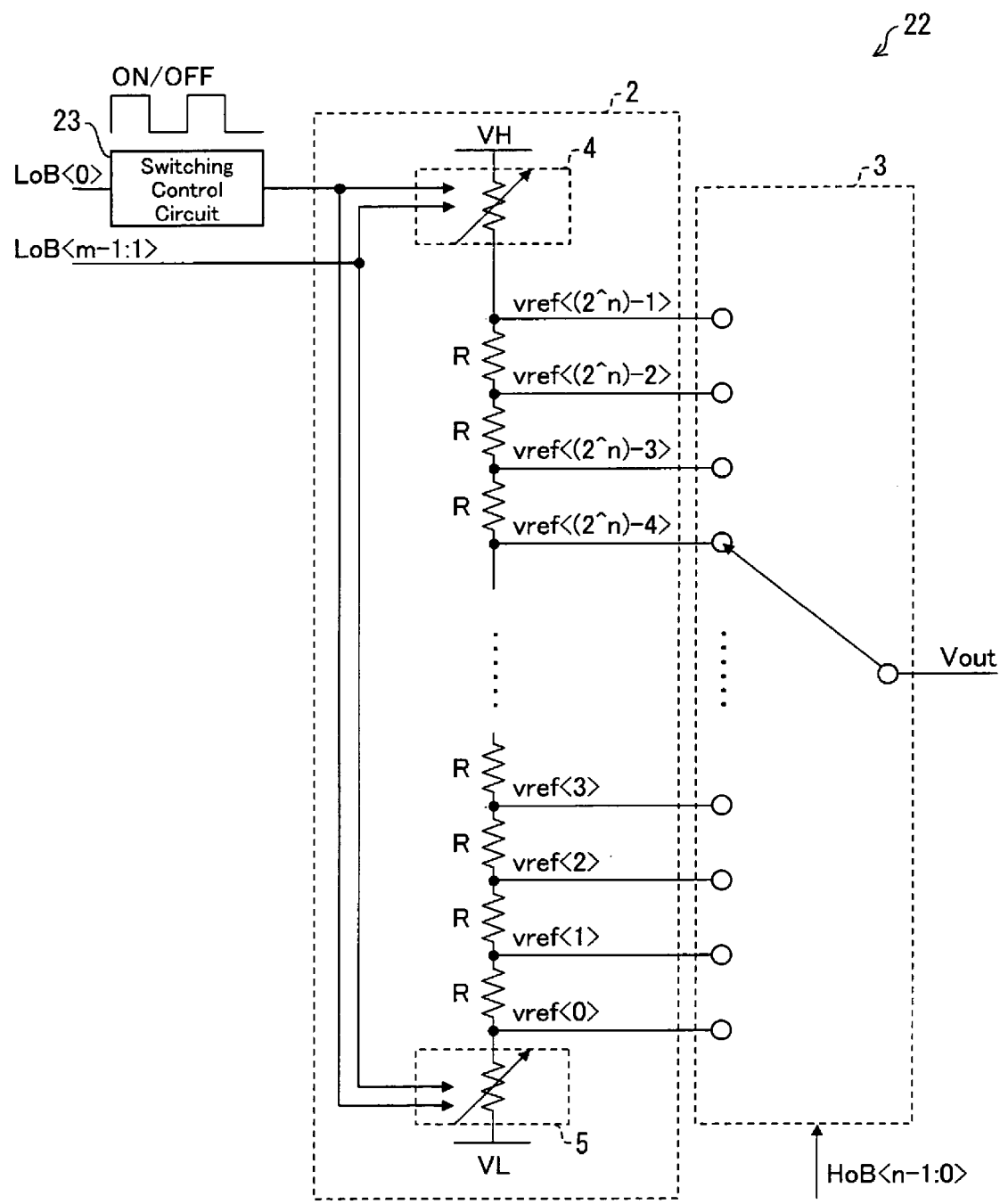
FIG. 3

FIG. 3 is a circuit diagram of a D/A converter 22 in accordance with example 2. The D/A converter 22 has the same configuration as the D/A converter 1 of example 1 and additionally includes a switching control circuit 23. The D/A converter 22 is characterized by its ability to control switching between the resistance RH of the variable resistor 4 and the resistance RL of the variable resistor 5 according to the least significant bit LoB<0> (least significant bit $L_0$) and thereby produce output voltages with greater precision.

For example, if no switching control is carried out when the least significant bit LoB<0>=0 and a (n+m)-bit digital signal consisting of n upper bits plus m lower bits is to be converted to analog voltage, the output voltage Vout produced is given by equation (13) similarly to example 1.

$$Vout=VL+(VH-VL)*(k+1*2\hat{\ }m)/2\hat{\ }(m+n) \quad (13)$$

where k=0 to 2^m-1 and l=0 to 2^n-1.

Switching control is carried out by repeatedly toggling the least significant bit LoB<0> between 1 and 0 as an example, in which case the output voltage Vout toggles between an output voltage Vout_H for the least significant bit LoB<0>=1 and an output voltage Vout_L for the least significant bit LoB<0>=0.

The output voltage Vout_L is equal to the Vout in equation (13) and calculated from equation (16). As the least significant bit LoB<0> increases from 0 to 1, "k" in RH given by equation (5) and RL given by equation (6), both discussed in example 1, is replaced by "k+1." As "k" is replaced by "k+1" in equation (16), the output voltage Vout_H is calculated from equation (17).

$$Vout\_L=VL+\{VH-VL\}*(k+1*2\hat{\ }m)/2\hat{\ }(n+m) \quad (16)$$

$$Vout\_H=VL+(VH-VL)*\{(k+1)+1*2\hat{\ }m\}/2\hat{\ }(n+m) \quad (17)$$

Letting "a" represent the period in which LSB<0>=1 and 1-a represent the period in which LSB<0>=0 where 0≦a≦1, the output voltage Vout_SW produced as a result of switching control is averaged out and given by equation (18).

$$Vout\_sw=VL+\{a*Vout\_H+(1-a)*Vout\_L\} \quad (18)$$

Expanding the third term on the right side of equation (18) and collecting terms containing "a" yields equation (19).

$$Vout\_sw=VL+Vout\_L+a*(Vout\_H-Vout\_L) \quad (19)$$

Substituting equations (16) and (17) into equation (19) and collecting terms containing (VH-VL) yields equation (20).

$$Vout\_sw=2VL+(VH-VL)*\{(k+1*2\hat{\ }m)/2\hat{\ }(n+m)+a/2\hat{\ }(n+m)\} \quad (20)$$

Factoring out 2^(n+m) in the second term on the right side of equation (20) and sorting out the numerator yields equation (21).

$$Vout\_sw=2VL+(VH-VL)*\{1*2\hat{\ }m+(k+a)\}/2\hat{\ }(n+m) \quad (21)$$

Since "a" is added to the term of the variable "k" which is related to the m lower bits, n+m bit or greater resolution is achieved depending on the value "a" (0≦a≦1).

For example, if a=0.75, that is, if the period in which LSB<0>=1 is 75%, the output voltage Vout_SW produced as a result of switching control is given by equation (22) which is equivalent to equation (21) with a=0.75 being plugged in.

$$Vout\_sw=2VL+(VH-VL)*\{1*2\hat{\ }m+(k+0.75)\}/2\hat{\ }(n+m) \quad (22)$$

Alternatively, if a=0.50, that is, if the period in which LSB<0>=1 is 50%, the output voltage Vout_SW produced as a result of switching control is given by equation (23) similarly to the case with equation (22).

$$Vout\_sw=2VL+(VH-VL)*\{1*2\hat{\ }m+(k+0.50)\}/2\hat{\ }(n+m) \quad (23)$$

Furthermore, if a=0.25, that is, if the period in which LSB<0>=1 is 25%, the output voltage Vout_SW produced as a result of switching control is given by equation (24).

$$Vout\_sw=2VL+(VH-VL)*\{1*2\hat{\ }m+(k+0.25)\}/2\hat{\ }(n+m) \quad (24)$$

If a=0, that is, if the period in which LSB<0>=1 is 0%, the output voltage Vout_SW produced as a result of switching control is given by equation (25).

$$Vout\_sw=2VL+(VH-VL)*(1*2\hat{\ }m+k)/2\hat{\ }(n+m) \quad (25)$$

As described in the foregoing, in the D/A converter 22, switching control is carried out according to the least significant bit LoB<0> (least significant bit $L_0$). Hence, the resistances of the variable resistors 4 and 5 change according to the least significant bit LoB<0>, and the output voltage Vout_sw also changes according to the least significant bit LoB<0>. The mechanism enables production of output voltages with greater precision.

In addition, by giving "a" a 2^p weight, that is, a p-bit weight as indicated in equation (26), the output voltage Vout_SW is given by equation (27) and has a resolution of n+m+p bits. Note in equation (26) that q=0 to 2^p-1.

$$a=q/2\hat{\ }p \quad (26)$$

$$Vout\_sw=2VL+(VH-VL)*\{1*2\hat{\ }(m+p)+(k+q)\}/2\hat{\ }(n+m+p) \quad (27)$$

Figure 4:
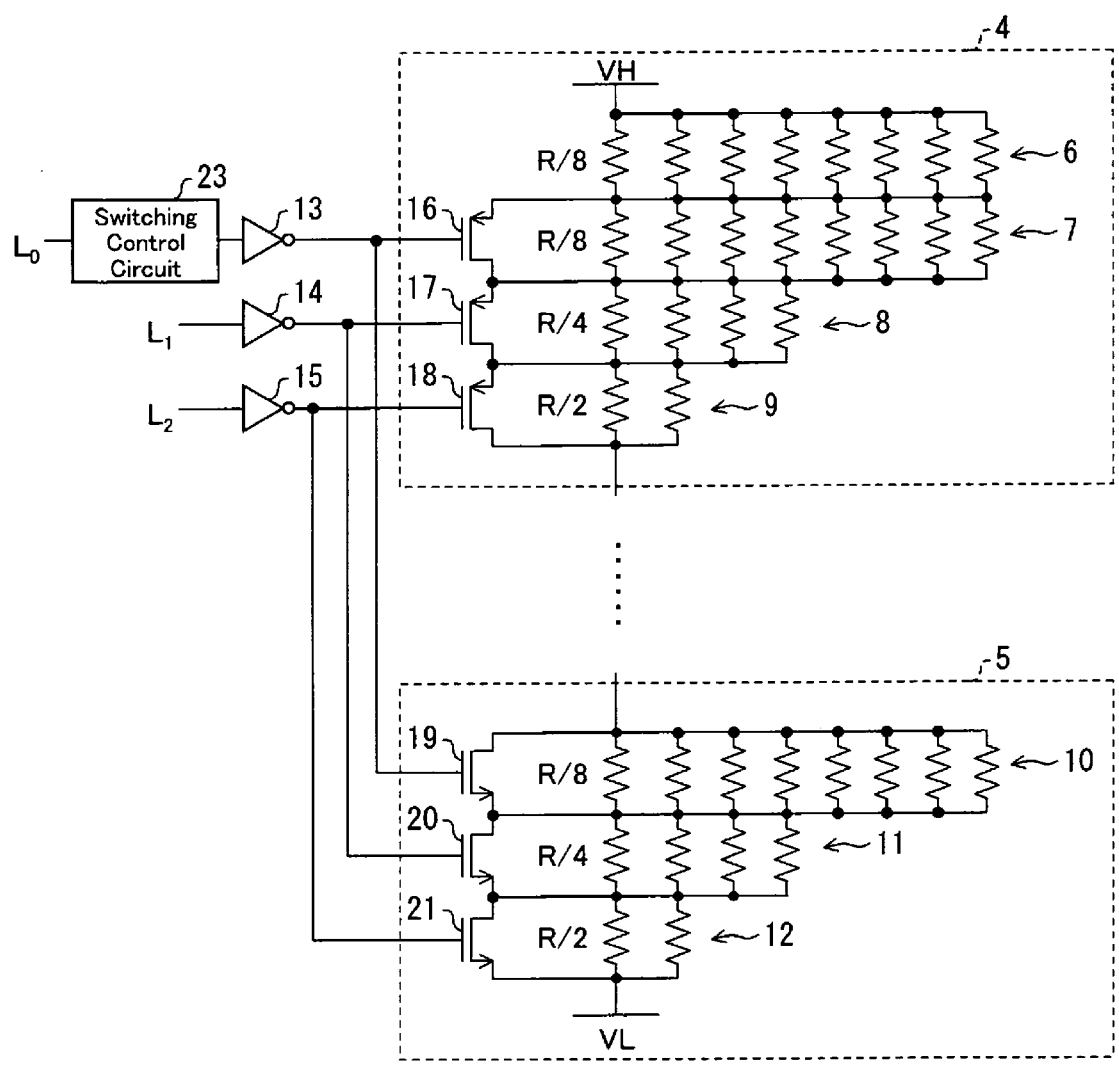
FIG. 4

FIG. 4 is circuit diagram of the variable resistors 4 and 5 when m=3 in the D/A converter 22. The circuit in FIG. 4 has the same configuration as the circuit in FIG. 2 and additionally includes a switching control circuit 23. Switching is controlled by means of the least significant bit $L_0$ to obtain Vout_L given by equation (16) and Vout_H given by equation (17).

Example 3

Figure 5:
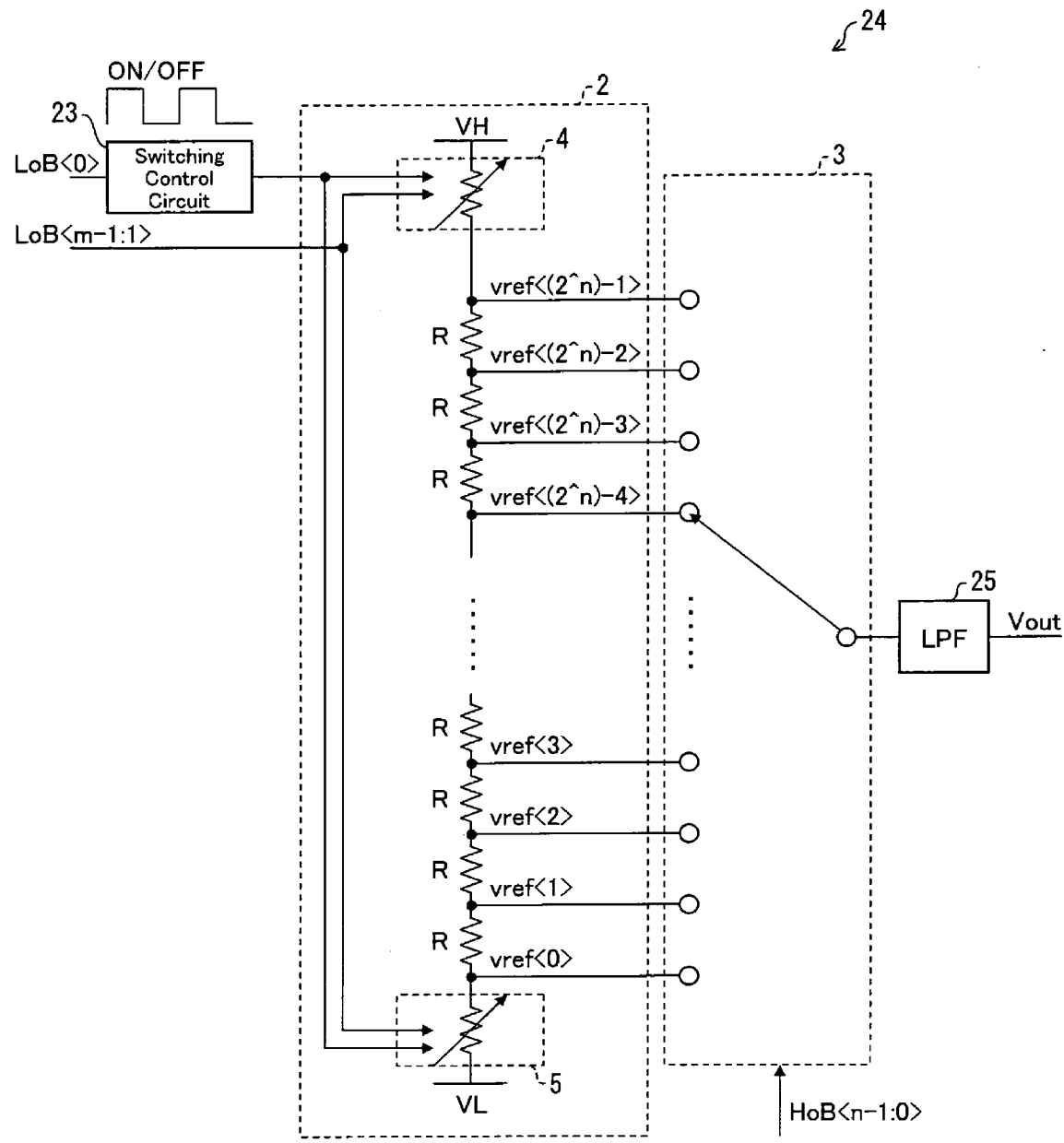
FIG. 5

FIG. 5 is circuit diagram of a D/A converter 24 in accordance with example 3. The D/A converter 24 has the same configuration as the D/A converter 22 of example 2 and additionally includes a LPF (lowpass filter) 25. The input of the LPF 25 is connected to the output of the switching circuit 3. The LPF 25 outputs an output voltage Vout. In the D/A converter 24, the LPF 25 is capable of removing the noise on the output voltage Vout which occurs when the switching circuit 3 carries out the switching.

Each reference voltage circuit of the present invention includes one of the D/A converters discussed above. The circuit has a simple configuration and is still capable of providing reference voltages with high precision.

Summary of Embodiments

Each D/A converter 1, 22 discussed in embodiments of the present invention is a D/A converter for converting a digital signal consisting of n upper bits HoB<n-1:0> and m lower bits LoB<m-1:0> to an output voltage Vout. The converter includes: a resistor-string circuit 2 containing (2^n)-1 resistors R of an equal resistance connected in series, a reference voltage VH and a reference voltage VL being applied across both terminals of the resistors R; a switching circuit 3 for selecting, according to the n upper bits HoB<n-1:0> of the digital signal, a divided voltage produced by the resistor-string circuit 2 for output as the output voltage Vout; and the variable resistors 4 and 5 connected to the terminals of the (2^n)-1 resistors R connected in series, the variable resistors 4 and 5 exhibiting resistances RH and RL determined according to the m lower bits LoB<m-1:0> of the digital signal.

According to the configuration, the output voltage Vout is produced by means of the resistances RH and RL determined in the variable resistors 4 and 5 according to the m bits of the digital signal. The configuration requires fewer wires connecting the resistor-string circuit 2 to the switching circuit 3, fewer resistors R, and fewer switches in the switching circuit 3 than the conventional D/A converter. Circuit size is thus reduced. A D/A converter is realized which is capable of converting high bit (9 to 11 bits) digital signals.

Unlike the conventional D/A converter, the D/A converter 1, 22 needs no internal D/A converters. Therefore, current consumption does not increase due to the addition of D/A converters. Precision in D/A conversion is dictated by the relative precision of the variable resistors 4 and 5 connected to the reference voltages VH and VL. Thus, the precision in D/A conversion does not fall by as great an amount as is the case with the conventional D/A converter. A high precision D/A converter is provided.

In the D/A converters 1 and 22, the resistances RH and RL of the variable resistors 4 and 5 may be given a weight by a power of 2.

Accordingly, the resistances RH and RL of the variable resistors 4 and 5 are readily obtainable.

The D/A converter 22 may further include a switching control circuit 23 for controlling switching of the resistances RH and RL of the variable resistors 4 and 5 according to a least significant bit $L_0$ of the digital signal containing the m lower bits LoB<m−1:0>.

Accordingly, the resistances RH and RL of the variable resistors 4 and 5 change according to the least significant bit $L_0$. Vout_sw also changes according to the least significant bit $L_0$. The output voltage is produced with greater precision.

In the D/A converter 22, a period "a" in which the least significant bit $L_0$ is HIGH may be given a weight by $2^p$.

Accordingly, the output voltage is produced with precision of n+m+p bits, that is, the number of the upper bits HoB<n−1:0>, plus the number of the lower bits LoB<m−1:0>, plus the power count of the weight given to the period "a" in which the least significant bit $L_0$ is HIGH.

The D/A converter 24 may further include a LPF 25 connected to an output of the switching circuit 3.

Accordingly, the LPF 25 removes the noise on the output voltage Vout which occurs when the switching circuit 3 carries out the switching.

The reference voltage circuit of the present invention includes one of the D/A converters. The circuit has a simple configuration and is still capable of providing reference voltages with high precision.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

The invention claimed is:

1. A D/A converter for converting a digital signal consisting of n upper bits and m lower bits to an analog voltage, said converter comprising:
voltage dividing means containing (2 n)−1 resistors of an equal resistance connected in series, a first reference voltage and a second reference voltage being applied across both terminals of the resistors;
selecting means for selecting, according to the n upper bits of the digital signal, a divided voltage produced by the voltage dividing means for output as the analog voltage; and
two variable resistors connected to the terminals of the (2 n)−1 resistors connected in series, said variable resistors exhibiting resistances determined according to the m lower bits of the digital signal, the resistances of the two variable resistors given a weight by a power of 2.

2. A D/A converter configured to convert a digital signal consisting of n upper bits and m lower bits to an analog voltage, the converter comprising:
voltage dividing means containing (2 n)−1 resistors of an equal resistance connected in series, a first reference voltage and a second reference voltage being applied across both terminals of the resistors;
selecting means for selecting, according to the n upper bits of the digital signal, a divided voltage produced by the voltage dividing means for output as the analog voltage;
two variable resistors connected to the terminals of the (2 n)−1 resistors connected in series, said variable resistors exhibiting resistances determined according to the m lower bits of the digital signal; and
switching control means for controlling switching of the resistances of the two variable resistors according to a least significant bit of the digital signal containing the m lower bits.

3. The D/A converter as set forth in claim 2, wherein a period in which the least significant bit is HIGH is given a weight by a power of 2.

4. The D/A converter as set forth in claim 2, further comprising a lowpass filter connected to an output of the selecting means.

5. A reference voltage circuit, comprising the D/A converter as set forth in claim 1.

6. A D/A converter, comprising:
a voltage dividing circuit including a plurality of resistors, a first variable resistor and a second variable resistor, the plurality of resistors connected in series between the first and second variable resistors, resistances of the first and second variable resistors configured to vary according to m lower bits of a digital signal;
first and second voltage sources configured to apply a voltage across the plurality of resistors, the first variable resistor and the second variable resistor;
a selector circuit configured to select, according to n upper bits of the digital signal, a divided voltage of the voltage dividing circuit for output as an analog voltage; and
a switching control circuit configured to control switching of the resistances of the two variable resistors according to at least one of the m lower bits of the digital signal.

7. The D/A converter as set forth in claim 6, wherein the switching control circuit includes a clock signal generator configured to output a plurality of clock signals, a duty cycle of each of the plurality of clock signals being different, and
the switching control circuit is configured to output a switching signal based on at least one of the clock signals to toggle the at least one of the m lower bits.

8. The D/A converter as set forth in claim 7, wherein a bit resolution of the voltage dividing circuit and the selector circuit is n+m bits, and
the switching control circuit is configured to increase a bit resolution of the D/A converter to n+m+p bits.

9. The D/A converter as set forth in claim 7, wherein the switching control circuit is configured to adjust the analog voltage output in response to the digital signal based on a target digital to analog conversion.

10. The D/A converter as set forth in claim 7, wherein the at least one of the m lower bits is toggled at least once during a single display period of a display.

11. A liquid crystal display comprising the D/A converter of claim 6.

* * * * *